(12) United States Patent
Vilas Boas et al.

(10) Patent No.: US 8,198,937 B1
(45) Date of Patent: Jun. 12, 2012

(54) SWITCHED-CAPACITOR AMPLIFIER CIRCUIT

(75) Inventors: Andre Luis Vilas Boas, Campinas (BR); Andre L. R. Mansano, The Hague (NL); Alfredo Olmos, Austin, TX (US); Fabio de Lacerda, Niteroi (BR)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/048,113

(22) Filed: Mar. 15, 2011

(51) Int. Cl.
*H03F 1/02* (2006.01)

(52) U.S. Cl. .............................. 330/9; 330/51; 330/258

(58) Field of Classification Search ................ 330/9, 51, 330/258
See application file for complete search history.

(56) References Cited

U.S. PATENT DOCUMENTS

| | | | |
|---|---|---|---|
| 4,543,534 A | | 9/1985 | Temes et al. |
| 5,142,238 A | | 8/1992 | White |
| 5,689,201 A | | 11/1997 | Temes et al. |
| 5,739,720 A | * | 4/1998 | Lee .................... 330/9 |
| 6,445,331 B1 | * | 9/2002 | Stegers ................ 341/172 |
| 6,909,391 B2 | * | 6/2005 | Rossi ................ 341/161 |
| 7,307,572 B2 | | 12/2007 | Garrity et al. |
| 7,345,530 B1 | * | 3/2008 | Li et al. .............. 330/9 |
| 7,746,260 B1 | * | 6/2010 | Tu et al. ............... 341/144 |
| 7,868,797 B2 | * | 1/2011 | Ito ................... 341/122 |
| 2007/0120595 A1 | | 5/2007 | Udupa et al. |
| 2011/0205098 A1 | * | 8/2011 | Sabut et al. .......... 341/155 |

OTHER PUBLICATIONS

Vilas Boas, Andre, et al., "A Switched-Capacitor Programmable Gain Amplifier Optimized for Motor Control Application Using Correlated Double Sampling Technique", 2010 IEEE, pp. 1240-1243.
Martin, Ken, et al., "A Differential Switched-Capacitor Amplifier", IEEE Journal of Solid-State Circuits, vol. SC-22, No. 1, Feb. 1987, pp. 104-106.
Lacerda, Fabio, et al., "A Differential Switched-Capacitor Amplifier with Programmable Gain and Output Offset Voltage", Freescale Semiconductor, Inc., Eintel15342, 2006.
Yoshizawa, Hirokazu, et al., "Switched-Capacitor Track-and-Hold Amplifiers With Low Sensitivity to Op-Amp Imperfections", IEEE Transactions on Circuits and Systems-I: Regular Papers, pp. 193-199, vol. 54, No. 1, Jan. 2007.
Enz, Christian C., "Circuit Techniques for Reducing the Effects of Op-Amp Imperfections: Autozeroing, Correlated Double Sampling, and Chopper Stabilization", Proceedings of the IEEE, pp. 1584-1614, vol. 84, No. 11, Nov. 1996.

* cited by examiner

*Primary Examiner* — Patricia Nguyen

(57) ABSTRACT

A switched-capacitor amplifier circuit (200 and 300) with rail-to-rail capability without requiring a rail-to-rail operational amplifier includes a switched-capacitor amplifier (202 and 302) and an input network (201) coupled to the switched-capacitor amplifier. The switched-capacitor amplifier includes a non-rail-to-rail operational amplifier (275 and 375). The input network prevents the non-rail-to-rail operational amplifier from receiving an input differential signal that has a common-mode voltage at or near rails of the non-rail-to-rail operational amplifier. Voltages at input terminals of the operational amplifier remain near analog ground, which is an arbitrary voltage level between the rails, during both phases of switching in the switched-capacitor amplifier. In one embodiment, the switched-capacitor amplifier uses a correlated double sampling technique.

20 Claims, 5 Drawing Sheets

102

SWITCHED-CAPACITOR AMPLIFIER CIRCUIT

BACKGROUND

1. Field

This invention relates generally to switched-capacitor circuits and more specifically to a switched-capacitor amplifier circuit that may be disposed on an integrated circuit.

2. Related Art

A switched-capacitor circuit is a circuit that provides signals that are discrete in time and continuous in voltage amplitude. Correlated double sampling (CDS) is a technique used with switched-capacitor circuits to measure small, slowly changing signals in the presence of large amounts of low frequency (1/f) noise and direct current (DC) input offset voltage. The CDS technique is a particular type of auto-zero technique, in which noise and a DC input offset voltage are sampled twice in each clock period. Switched-capacitor amplifiers often use the CDS technique to compensate for non-idealities of an operational amplifier (OpAmp) in the switched-capacitor circuit such as finite open-loop gain (hereinafter "OpAmp gain") and DC input offset voltage. In a non-CDS amplifier, a gain error of an OpAmp is approximately inversely proportional to the OpAmp gain, i.e., gain error≈1/gain of the OpAmp. The CDS technique minimizes the gain error of the OpAmp. The CDS technique effectively makes the gain error of the OpAmp in a switched capacitor amplifier inversely proportional to a square of the gain of the OpAmp, i.e., gain error≈1/gain².

In most switched-capacitor amplifiers that do not use the CDS technique, an output of an OpAmp is re-set to analog ground (AGND), which is defined as $(V_{DD}+V_{SS})/2$, on each occasion that the switched-capacitor amplifier samples an input signal during a sampling time phase, or phase one. During an amplification time phase, or phase two, the output of the OpAmp goes from AGND to a voltage that represents the input differential voltage multiplied by a gain. Capacitors are charged or re-charged during each phase to change the output of the switched-capacitor amplifier to a new value that represents a present input differential voltage multiplied by a gain.

In a switched-capacitor amplifier that uses the CDS technique (hereinafter "CDS amplifier"), the output of the OpAmp is not re-set to AGND at each phase one. In a CDS amplifier, the output of the OpAmp remains at the voltage that it had in an immediately previous phase two, and the output of the OpAmp is not re-set to AGND. In a CDS amplifier, the input signal is assumed to change very slowly with respect to a sampling frequency. Therefore, in any clock phase, the value of an output signal does not vary much from a value that it had during an immediately previous clock phase. Consequently, the CDS amplifier can take advantage of the output voltage from a previous sample (which is stored in a capacitor), and can obtain a new value during the amplification phase more quickly than if the output were re-set to AGND. This is because the previous output level is close in value to a next output value. By using the CDS technique, a switched-capacitor amplifier requires less time to produce each new output value.

A rail-to-rail OpAmp can properly amplify an input differential signal even if the input common-mode voltage is near either of the rails, i.e., $V_{DD}$ or $V_{SS}$, of a power supply. An input differential signal of an OpAmp comprises an input differential voltage plus an input common-mode voltage. A non-rail-to-rail input OpAmp (hereinafter "non-rail-to-rail OpAmp") has a limited input common-mode range and can properly amplify only differential signals that have a common-mode voltage near AGND. In other words, a non-rail-to-rail OpAmp cannot properly amplify a differential signal that has a common-mode voltage near either rail because the non-rail-to-rail OpAmp has a limited common-mode range.

The known CDS amplifier 102 comprises a first sampling switch 106 with one terminal connected to a VIP input terminal 104 and another terminal connected to a first sampling capacitor 130, and a second sampling switch 107 with one terminal connected to a VIN input terminal 105 and another terminal connected to a second sampling capacitor 131. The known CDS amplifier 102 also comprises a first grounding switch 108 with one terminal connected to the first sampling capacitor 130 and another terminal connected to an AGND terminal 103, and a second grounding switch 109 with one terminal connected to the second sampling capacitor 131 and another terminal connected to the AGND terminal 103. Additionally, the known CDS amplifier 102 comprises a first gain capacitor 140 with one end connected to a VN input terminal 162 of the OpAmp 160 and another end connected to the AGND terminal 103 when switch 142 is closed and connected to an output terminal 164 of the OpAmp when switch 144 is closed. The known CDS amplifier 102 also comprises a second gain capacitor 141 with one end connected to the AGND terminal 103 and another end connected to a VP input terminal 163 of the OpAmp 160. The known CDS amplifier 102 further comprises a first CDS capacitor 150 with one end connected to the output terminal 164 of the OpAmp 160 and another end connected to the VN input terminal 162 of the OpAmp when switch 152 is closed, and connected to the AGND terminal 103 when switch 154 is closed. The known CDS amplifier 102 further comprises a second CDS capacitor 151 with one end connected to the AGND terminal 103 and another end connected to the VP input terminal 163 of the OpAmp 160 when switch 153 is closed and connected to the AGND terminal 103 when switch 155 is closed.

The following assumes that the known CDS amplifier 102 has started, i.e., it has operated in phase one and phase two long enough to set properly the output voltage VO, and the voltages at the VN input terminal 162 and at the VP input terminal 163 of the OpAmp 160 are near AGND. In phase one (the sampling phase), only the F1 switches are closed, which allows sampling capacitors 130 and 131 to sample the input signal. The input signal can be expressed as $V_I=V_1+V_{CM}$, where $V_i$ is an input differential voltage, $V_i$=VIP−VIN, and where $V_{CM}$ is an input common-mode voltage, $V_{CM}$=(VIP+VIN)/2. In phase one, a right plate of gain capacitor 140 is coupled to the AGND terminal 103, CDS capacitor 150 closes the feedback loop around the OpAmp 160, and gain capacitor 140 stores any error voltage (due to OpAmp gain error and/or DC input offset voltage). In phase two (the amplification phase), only the F2 switches are closed, and the charges stored in sampling capacitors 130 and 131 are transferred to gain capacitors 140 and 141 to amplify the input differential voltage. The CDS capacitor 150 compensates for the gain error and/or the DC input offset voltage of the OpAmp 160 such that an output voltage VO of the OpAmp is not affected by these factors. However, disadvantageously, the output of the known CDS amplifier 102 is not immune to $V_{CM}$. The known CDS amplifier 102 has gain errors when $V_{CM}$ is close to either rail of the power supply.

In phase one, the F1 switches are closed. The known CDS amplifier 102 may work properly when the input common-mode voltage is near AGND. For example, when the common-mode voltage of the input signal is at AGND, the output error may not be greater than one-half of a least significant bit (LSB) with 16-bit resolution, where LSB=$V_{DD}/2^n$, where n is number of bits of resolution (LSB=$V_{DD}/2^{16}$ in this example). In other words, when the common-mode voltage of the input signal is at AGND, the CDS amplifier 102 amplifies the input signal with 16-bit resolution. However, when the common-mode voltage of the input signal is near $V_{DD}$ or $V_{SS}$, the output error of the known CDS amplifier 102 may be disadvantageously in the range of one-half of a LSB when the number of bits of resolution is 12-bits or fewer. In other words, the resolution of the CDS amplifier 102 reduces from sixteen bits, to twelve or fewer bits, when the common-mode input voltage is close to the power supply rails.

The following assumes that the inputs of the OpAmp 160 are near AGND. In phase one, by coupling the CDS capacitor 150 between a VN input terminal 162 and a VO output terminal of the OpAmp 160, a VN input voltage of the OpAmp is forced to be near AGND. In phase two, gain capacitor 140 is coupled between the VO output terminal 164 of the OpAmp 160 and the VN input terminal 162 of the OpAmp.

As an example, in phase one, a charge is placed on each of the sampling capacitors 130 and 131 (a charge equivalent to +50 mV on sampling capacitor 130 and a charge equivalent to −50 mV on sampling capacitor 131, with respect to AGND). In the known CDS amplifier 102, in phase two, a left plate of sampling capacitor 130 is coupled to the AGND terminal 103, thereby discharging the left plate of the sampling capacitor 130 and leaving a charge equivalent to −50 mV on the right plate of sampling capacitor 130. As a result of the left plate of sampling capacitor 130 being coupled to the AGND terminal 103, a corresponding current flows through gain capacitor 140. Sampling capacitor 130 and gain capacitor 140 are connected in series; therefore, a current flowing in sampling capacitor 130 is a same current flowing in gain capacitor 140 because no current flows into or out of the OpAmp 160, which is assumed to be ideal, i.e., has infinite input impedance. Provided that phase two is of sufficient duration, enough current flows during phase two to transfer all the charge in sampling capacitor 130 to gain capacitor 140. In one embodiment, gain capacitor 140 is half the size of sampling capacitor 130. In such embodiment, at the end of phase two, the voltage across the gain capacitor 140 is twice the voltage that was across sampling capacitors 130 and 131. A ratio sampling capacitor 130/gain capacitor 140 defines a gain of the known CDS amplifier 102. At the end of phase two, if gain capacitor 140 is half the size of sampling capacitor 130, then the voltage gain is two (2). At the end of phase two, the voltage across gain capacitor 140 is twice the voltage that was seen across sampling capacitors 130 and 131 at the beginning of phase two, i.e., the right plate of gain capacitor 140 is at a potential of 200 mV with respect to AGND. In such embodiment, at the end of phase two, an output voltage of the known CDS amplifier 102 is two times the input differential voltage of 100 mV, that is, the output voltage is +200 mV with respect to AGND. A disadvantage of the known CDS amplifier 102 is that, during phase two, the input common-mode voltage $V_{CM}$ affects the input of the OpAmp 160.

The known CDS amplifier 102 does not work properly if the common-mode voltage is not near AGND. When the common-mode voltage is not near AGND, the differential voltage at the input of the OpAmp 160 alternates, or pulses, between approximately AGND (during the sampling phase, or phase one) and a second voltage other than AGND (during the amplification phase, or phase two). During the sampling phase, the input to the OpAmp 160 is maintained near AGND because of the feedback loop comprising gain capacitor 140. (During the sampling phase, the input differential signal, VIP and VIN, is not presented to the input of the OpAmp 160, but is being stored in sampling capacitors 130 and 131.) During the amplification phase, charge is transferred between sampling capacitor 130 and gain capacitor 140. As a result, a voltage, which, in general, is at a potential other than AGND, appears at the input of the OpAmp 160. If the common-mode voltage is above AGND, the second voltage is at a potential below AGND. If the common-mode voltage is below AGND, the second voltage is at a potential above AGND. Such pulsing occurs because switches 108 and 109 alternately couple one of the input signal (during phase one) and AGND (during phase two) to the OpAmp 160. The peak-to-peak level of the pulses is directly proportional to a difference between the input common-mode voltage and AGND. Therefore, the peak-to-peak level of the pulses is small when the input common-mode voltage is near AGND. However, when the common-mode voltage is near $V_{DD}$ or near $V_{SS}$, such pulsing causes an error at the output of a non-rail-to-rail OpAmp. In the known switched-capacitor amplifier 102, when VIP and VIN are each near $V_{SS}$, the value of a VP input voltage at the VP input terminal 163 of the OpAmp 160 disadvantageously swings from almost AGND to almost $V_{DD}$ when going from phase one to phase two. Similar disadvantageous behavior occurs for the value of the VN input voltage at the VN input terminal 162 of the OpAmp 160 because the feedback loop is closed by CDS capacitor 150.

BRIEF DESCRIPTION OF THE DRAWINGS

The present invention is illustrated by way of example and is not limited by the accompanying figures, in which like references indicate similar elements. Elements in the figures are illustrated for simplicity and clarity.

DETAILED DESCRIPTION

Figure 2:
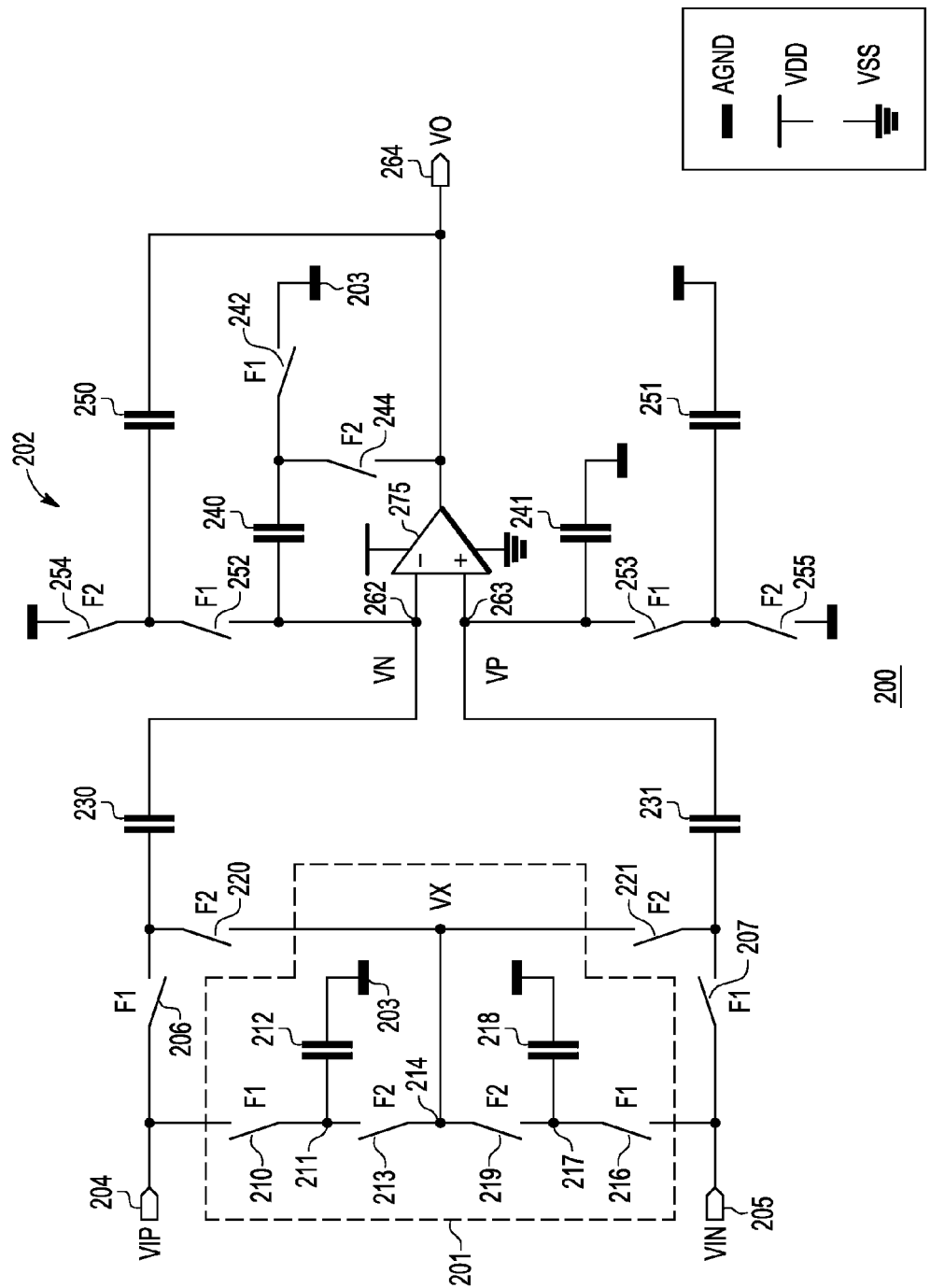
FIG. 2 is a schematic diagram of an amplifier circuit in accordance with the invention, which includes an input network and a switched-capacitor amplifier that has a single-ended output.

A switched-capacitor amplifier that lacks a rail-to-rail OpAmp (and uses instead a non-rail-to-rail OpAmp) needs a rail-to-rail input circuit so that the switched-capacitor amplifier can properly amplify an input signal that has a common-mode voltage near either rail of a power supply. FIG. 2 is a schematic diagram of a switched-capacitor amplifier circuit (hereinafter "amplifier circuit") 200 in accordance with the invention. The amplifier circuit 200 includes a switched-capacitor, rail-to-rail input circuit (hereinafter "input network") 201 and a switched-capacitor amplifier (hereinafter "switched-capacitor amplifier") 202. In one embodiment, the switched-capacitor amplifier 202 uses a correlated double-sampling (CDS) technique.

The switched-capacitor amplifier 202 comprises a first sampling switch 206 with one terminal connected to a VIP input terminal 204 and another terminal connected to a first sampling capacitor 230, and a second sampling switch 207 with one terminal connected to a VIN input terminal 205 and another terminal connected to a second sampling capacitor 231. The switched-capacitor amplifier 202 also comprises a first common-mode switch 220 with one terminal connected to the first sampling capacitor 230 and another terminal connected to a VX node 214 of the input network 201, and a second common-mode switch 221 with one terminal connected to the second sampling capacitor 231 and another terminal connected to the VX node 214. One end of the first sampling capacitor 230 is connected to a VN input terminal 262 of an OpAmp 275. One end of the second sampling capacitor 231 is connected to a VP input terminal 263 of the OpAmp 275. Additionally, the switched-capacitor amplifier 202 comprises a first gain capacitor 240 with one end connected the VN input terminal 262 of the OpAmp 275 and another end connected to the AGND terminal 203 when switch 242 is closed and connected to an output terminal 264 of the OpAmp when switch 244 is closed. The switched-capacitor amplifier 202 further comprises a second gain capacitor 241 with one end connected to the AGND terminal 203 and another end connected to the VP input terminal 263 of the OpAmp 275. The switched-capacitor amplifier 202 further comprises a first CDS capacitor 250 with one end connected to the output terminal 264 of the OpAmp 275 and another end connected to the VN input terminal 262 of the OpAmp when switch 252 is closed and connected to the AGND terminal 203 when switch 254 is closed. The switched-capacitor amplifier 202 further comprises a second CDS capacitor 251 with one end connected to the AGND terminal 203 and another end connected to the VP input terminal 263 of the OpAmp 275 when switch 253 is closed and connected to the AGND terminal 203 when switch 255 is closed.

The operation of the switched-capacitor amplifier 202 is described in the published article entitled, "A Differential Switched-Capacitor Amplifier with Programmable Gain and Output Offset Voltage", by Lacerda et al., which article is hereby fully incorporated by reference herein. The operation of the switched-capacitor amplifier 202 is also described in the published article entitled, "A Switched-Capacitor Programmable Gain Amplifier Optimized for Motor Control Application Using Correlated Double Sampling Technique", by Vilas Boas et al., which article is hereby fully incorporated by reference herein.

The input network 201 comprises a first switch 210 with one terminal connected to a VIP input terminal 204 and another terminal connected to a first intermediate node 211, and a first capacitor 212 with one end connected to the first intermediate node and another end connected to an AGND terminal 203. The input network 201 also comprises a second switch 213 with one terminal connected to the first intermediate node 211 and the other terminal connected to the VX node 214. The input network 201 also comprises a third switch 216 with one terminal connected to a VIN input terminal 205 and the other terminal connected to a second intermediate node 217, and a second capacitor 218 with one end connected to the second intermediate node and another end connected to the AGND terminal 203. The input network 201 also comprises a fourth switch 219 with one terminal connected to the second intermediate node 217 and another terminal connected to the VX node 214. In one embodiment, each switch is implemented by a metal oxide semiconductor field effect transistor (MOSFET).

The input network 201 of the amplifier circuit 200 determines a value of the input common-mode voltage and maintains VX node 214 at the input common-mode voltage during both phase one and phase two. In phase two, VX node 214 is coupled to the left plate of sampling capacitors 230 and 231. Therefore, in phase two of the amplifier circuit 200, the input common-mode voltage, $V_{CM}$, moves a compensating voltage at VX node 214 higher or lower to compensate for a deviation from AGND.

The input network 201 emulates, in some ways, a voltage-divider circuit composed of resistors. Advantageously, because the input network 201 uses switched capacitors instead of resistors, the input network does not consume any direct current (DC) power. Also, the size of the input network 201 is smaller than a voltage-divider circuit composed of resistors because such resistors would need very large ohmic values to avoid excessive DC power consumption.

One application of the amplifier circuit 200 is in a control system for a vehicle window-lift motor. Because the environment of such an application may be noisy and because an input voltage in such an application may be relatively small, the input voltage is measured in a differential manner. The amplifier monitors a voltage $V_i$ across an input resistor (not shown); however, the input signal, $V_I=V_i+V_{CM}$, can be above or below AGND. By measuring the voltage on each side of the input resistor, the adverse effect of most low frequency common-mode noise is eliminated. The differential signal is typically 100-300 mV, and the common-mode noise level is typically approximately 50 mV. Typically, $V_{DD}$=5V, $V_{SS}$=0V. AGND is $V_{DD}/2$; therefore, AGND is 2.5V. In such example, the rails of the input are 0V and 5V. In the vehicle window-lift motor application, the common-mode voltage of an input differential signal may be near one of the rails, such as near 0V, i.e., far from AGND. In one embodiment of the automobile window lift motor application, VIN=0V, the input differential voltage is 40 mV, and, therefore, in such example, the common-mode voltage is only 20 mV.

In known circuits, if a non-rail-to-rail OpAmp receives an input differential signal that has a common-mode voltage at or near the power supply rails, the output(s) of the non-rail-to-rail OpAmp disadvantageously saturate at $V_{DD}$ or at $V_{SS}$. However, the input network 201 advantageously prevents the non-rail-to-rail OpAmp 275 of the amplifier circuit 200 from receiving an input differential signal that has a common-mode voltage at or near the power supply rails.

In one example, $V_{DD}$=5V, $V_{SS}$=0V, and AGND is 2.5V, and the rails of the input are 0V and 5V. The effect of the input network on the operation of the amplifier circuit 200 can be better analyzed when the input common-mode voltage is assumed to be near AGND rather than near one of the rails. Therefore, to better analyze the operation, assume that VIP=2.55V, or 50 mV above AGND, and assume that VIN=2.45V, or 50 mV below AGND. Based on the foregoing assumptions, there is a 100 mV input differential signal. If the gain of the switched-capacitor amplifier 202 is high enough, it can be assumed that the voltage at the VN input terminal 262 and the voltage at the VP input terminal 263 of the OpAmp 275 are each close to AGND. This is a known attribute of circuits based on an OpAmp, such as switched-capacitor amplifiers. Therefore, in phase one, the left plate of sampling capacitor 230 is at a potential of +50 mV with respect to AGND, and the right plate of sampling capacitor 230 is at a potential of approximately AGND. Similarly, in phase one, the left plate of sampling capacitor 231 is at a potential of −50 mV with respect to AGND, and the right plate of sampling capacitor 231 is at a potential of approximately AGND.

During the sampling phase, or phase one, the amplifier circuit 200 samples the input signal at the VIP input terminal 204 and the VIN input terminal 205. During the amplification phase, or phase two, the amplifier circuit 200 amplifies the input signal. Unlike in the known CDS amplifier 102, the VN and VP input voltages of the OpAmp 275 advantageously remain near AGND during both phase one and phase two.

During phase one, when the input voltage VIP is sampled on a left plate of sampling capacitor 230, a same input voltage is sampled on a left plate of first capacitor 212. A right plate of first capacitor 212 is coupled to the AGND terminal 203. During phase one, a right plate of sampling capacitor 230 is near AGND because the CDS capacitor 250 closes the feedback loop around the OpAmp 275.

During phase one, VIP is stored on a left plate of sampling capacitor 230 and VIN is stored on a left plate of the sampling capacitor 231. During phase two, the left plate of first capacitor 212 and the left plate of second capacitor 218 are coupled to each other and to the VX node 214. Then, the charge stored in each first capacitor 212 and second capacitor 218 is distributed between such capacitors proportionally to the capacitance of such capacitors. Assuming first capacitor 212 is equal to second capacitor 218, the compensating voltage at the VX node 214 is equal to the average voltage between VIP and VIN input terminals 204 and 205, or the common-mode voltage, i.e., $V_{CM}$=(VIP+VIN)/2. First capacitor 212 and second capacitor 218 have a same size. In one embodiment, first capacitor 212 and second capacitor 218 each have a capacitance in a range of hundreds of picofarads. Sampling capacitor 230 and sampling capacitor 231 have a same size. In one embodiment, sampling capacitor 230 is the same size as first and second capacitors 212 and 218. If the input common-mode voltage is at AGND, then the charge on first capacitor 212 exactly cancels the charge on second capacitor 218, and, as a result, the compensating voltage at VX node 214 is AGND. However, in general, the compensating voltage at VX node 214 is at the input common-mode voltage. For example, if the input common-mode voltage is 500 mV above AGND, and the input differential voltage is 100 mV, then VIP is 550 mV+AGND, and VIN is 450 mV+AGND, and, during phase two, the voltage at the VX node is equal to +500 mV with respect to AGND, i.e., at the input common-mode voltage.

During phase one, there is 550 mV+AGND on the left plate of sampling capacitor 230. During phase one, the potential difference between the left and right plates of sampling capacitor 230 is 550 mV because a right plate of sampling capacitor 230 is at AGND potential because the CDS capacitor 250 closes the feedback loop around the OpAmp 275.

During phase one, there is 450 mV+AGND on the left plate of sampling capacitor 231. During phase one, the potential difference between the left and right plates of sampling capacitor 231 is 450 mV because a right plate of sampling capacitor 231 is at AGND potential as a result of the CDS capacitor 250 closing the feedback loop around the OpAmp 275.

During phase two, the input common-mode voltage produced by the input network 201 during an immediately previous phase one is coupled to the left plate of the sampling capacitor 230. For example, the left plate of sampling capacitor 230 and the left plate of sampling capacitor 231 are coupled to the VX node, which causes 500 mV+AGND to appear on their left plates during phase two because 500 mV+AGND was the compensating voltage at the VX node 214 at the end of the immediately previous phase one.

The voltage stored in sampling capacitor 230 at the end of phase one is a positive half of the input differential voltage plus the input common-mode voltage. The voltage stored in sampling capacitor 231 at the end of phase one is a negative half of the input differential voltage plus the input common-mode voltage.

CDS capacitor 250 acts as a feedback capacitor during phase one. During phase one, CDS capacitor 250 closes a feedback loop around the OpAmp 275. During phase one, the left plate of CDS capacitor 250 is coupled to the VN input terminal 262 and its right plate is coupled to the output of the OpAmp 275. During phase two, the right plate of CDS capacitor 250 remains connected to the output, but its left plate becomes coupled to the AGND terminal 203, and, as a result, CDS capacitor 250 appears as a load to the output of the OpAmp 275.

During phase one, the left plate of CDS capacitor 251 is coupled to a VP input terminal 263 of the OpAmp 275 and its right plate is coupled to the AGND terminal 203. During phase two, the right plate of CDS capacitor 251 remains connected the AGND terminal 203, and its left plate becomes coupled to the AGND terminal 203 and, as a result, CDS capacitor 251 is discharged. If the VN and VP input voltages are at a same potential, the output of the OpAmp 275 is ideally 0V with respect to AGND.

In the amplifier circuit 200, the input of the OpAmp 275 is, advantageously, not re-set at each phase one. In the amplifier circuit 200, the voltage at the VN input terminal 262 and the voltage at the VP input terminal 263 of the OpAmp 275 advantageously remain near AGND during both phase one and phase two. An advantage of not re-setting the input of the OpAmp 275 at each phase one is an ability to use large capacitors. The ability to use large capacitors is advantageous because, in some semiconductor technologies, small capacitors cannot be easily achieved. Also, by using large capacitors, the amplifier circuit 200 is less affected by parasitic capacitance that is present in integrated circuits.

Figure 3:
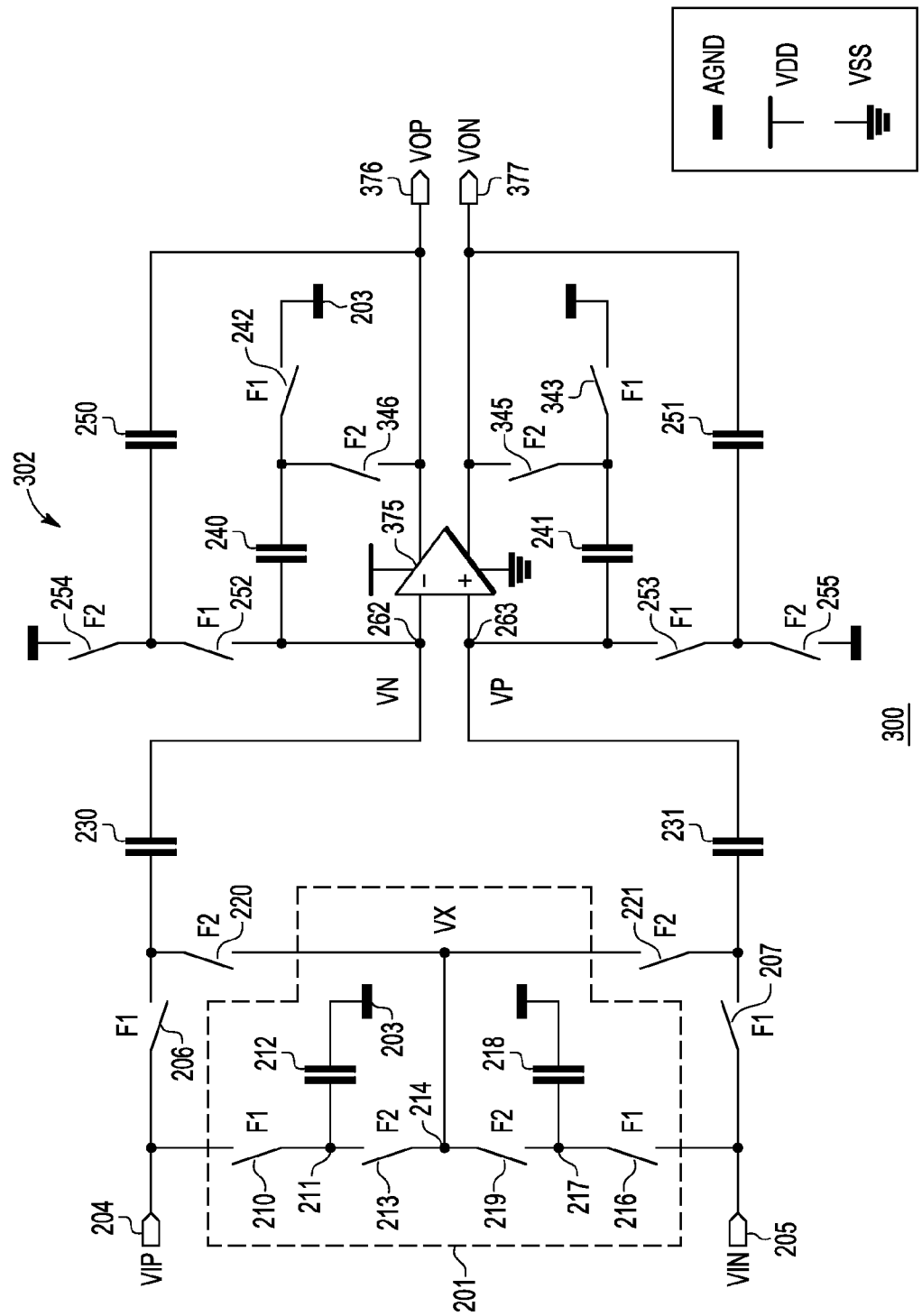
FIG. 3 is a schematic diagram of another amplifier circuit in accordance with the invention, which includes the input network and another switched-capacitor amplifier that has a fully differential architecture.

FIG. 3 is a schematic diagram of another switched-capacitor amplifier circuit (hereinafter "amplifier circuit") 300 in accordance with the invention, which comprises a switched-capacitor amplifier 302 that includes an OpAmp 375 that has a fully differential architecture, i.e., differential input and differential output. The differential output from OpAmp 375 appears at a VOP output terminal 376 and a VON output terminal 377 of the OpAmp. Amplifier circuit 300 includes a switch 346 instead of the switch 244 shown in FIG. 2. Switch 346 couples the other end of the first gain capacitor 240 to the VOP output terminal 376 of the OpAmp 375 during phase two. Amplifier circuit 300 also includes a switch 343 that couples the other end of the second gain capacitor 241 to the AGND terminal 203 during phase one and switch 345 that couples other end of the second gain capacitor 241 to the VON output terminal 377 of the OpAmp 375 during phase two. In most other respects, the amplifier circuit 300 is similar to the amplifier circuit 200; therefore, a description of elements common to both amplifier circuits is not repeated herein.

In one embodiment of the amplifier circuit 200 and 300, when the clock signal is low, all the phase two switches are closed and all the phase one switches are open. In such embodiment, when the clock signal is high, all the phase two switches are open and all the phase one switches are closed. In another embodiment of the amplifier circuit 200 and 300, when the clock signal is high, all the phase two switches are closed and all the phase one switches are open. There is a non-overlap behavior in the operation of the phase one and phase two switches, i.e., at no moment are any of the phase one switches and any of the phase two switches both closed. In one embodiment, the frequency of the clock signal is between 40 kHz and 1 MHz.

The following equations describe the operation of the amplifier circuit 300, which has a differential output. Other equations (not shown) can be derived for the amplifier circuit 200, which has a singled-ended output.

For phase one:

$$\frac{VP1+VN1}{2} = \frac{1}{C1+C2+C3} \cdot \left\{ \left[ \frac{VIP+VIN}{2} - VX'' \right] \cdot C1 + \left[ \frac{VP2''+VN2''}{2} \right] \cdot [C1+C2] + \left[ \frac{VOP1+VON1}{2} \right] \cdot C3 + \left[ AGND - \frac{VOP2''+VON2''}{2} \right] \cdot [C2+C3] \right\}$$

where $$\frac{VP1+VN1}{2}$$

is the common-mode voltage at the VN input terminal 262 and at the VP input terminal 263 of OpAmp 375 during the sampling phase (phase one). This is also the common-mode voltage at an input differential pair (not shown) within the OpAmp 375;

$$\frac{VIP+VIN}{2}$$

is the common-mode voltage at the differential input terminals 204 and 205 of the amplifier circuit 300 during the sampling phase (phase one);
VX" is the compensating voltage at the VX node 214 during an immediately previous phase (phase two);

$$\frac{VP2''+VN2''}{2}$$

is the common-mode voltage at the VN input terminal 262 and at the VP input terminal 263 of OpAmp 375 during the immediately previous phase (phase two);

$$\frac{VOP1+VON1}{2}$$

is the common-mode voltage at the differential output 376 and 377 of the amplifier circuit 300 during the sampling phase (phase one); and $$\frac{VOP2''+VON2''}{2}$$

is the common-mode voltage at the differential output 376 and 377 of the amplifier circuit 300 during the immediately previous phase (phase two).
For phase two:

$$\frac{VP2+VN2}{2} = \frac{VP1+VN1}{2} + \frac{1}{C1+C2} \cdot \left\{ \left[ VX - \frac{VIP+VIN}{2} \right] \cdot C1 + \left[ \frac{VOP2+VON2}{2} - AGND \right] \cdot C2 \right\}$$

where $$\frac{VP2+VN2}{2}$$

is the common-mode voltage at the VN input terminal 262 and the VP input terminal 263 of OpAmp 375 during an amplification phase (phase two);

$$\frac{VP1+VN1}{2}$$

is the common-mode voltage at the VN input terminal 262 and the VP input terminal 263 of OpAmp 375 during an immediately previous phase (phase one);
VX is the compensating voltage at the VX node 214 during the amplification phase (phase two);

$$\frac{VIP+VIN}{2}$$

is the common-mode voltage at differential input terminals 204 and 205 of the amplifier circuit 300 during the immediately previous phase (phase one); and $$\frac{VOP2+VON2}{2}$$

is the common-mode voltage at the differential output 376 and 377 of the amplifier circuit 300 during the amplification phase (phase two).

The differential output of the OpAmp 375 includes an additional circuit called the common-mode feedback (CMFB) circuit (not shown). The CMFB circuit calculates the common-mode voltage at the differential output of the OpAmp 375 and compares it with a reference voltage, usually AGND. This voltage comparison is fed into a control pin (not shown) of OpAmp 375, which, in turn, controls a biasing output stage of the OpAmp. A goal is to keep the common-mode voltage identical to the reference voltage in all conditions. Therefore, if the CMFB circuit is working properly, the following is true during all operating time of the amplifier circuit 300:

$$\frac{VOP1+VON1}{2} \approx \frac{VOP2+VON2}{2} \approx \frac{VOP2''+VON2''}{2} \approx AGND$$

Consequently, the equations presented above can be reduced, as follows.
In phase one:

$$\frac{VP1+VN1}{2} \approx \frac{1}{C1+C2+C3} \cdot \left\{ \left[ \frac{VIP+VIN}{2} - VX'' \right] \cdot C1 + \left[ \frac{VP2''+VN2''}{2} \right] \cdot [C1+C2] + AGND \cdot C3 \right\}$$

Phase two:

$$\frac{VP2+VN2}{2} \approx \frac{VP1+VN1}{2} + \frac{1}{C1+C2} \cdot \left\{ \left[ VX - \frac{VIP+VIN}{2} \right] \cdot C1 \right\}$$

The amplifier circuit 300 stabilizes the common-mode voltage at the input differential pair within the OpAmp 375 during both phases by canceling the terms related to $$\frac{VIP+VIN}{2}$$

by means of an appropriate value at the compensating voltage at the VX node 214:

$$VX \approx VX'' \approx \frac{VIP+VIN}{2}$$

As a result, the common-mode voltage at the VN input terminal 262 and the VP input terminal 263 of OpAmp 375 reduces to:
For phase one:

$$\frac{VP1+VN1}{2} \approx \frac{1}{C1+C2+C3} \cdot \left\{ \left[ \frac{VP2''+VN2''}{2} \right] \cdot [C1+C2] + AGND \cdot C3 \right\}$$

For phase two:

$$\frac{VP2+VN2}{2} \approx \frac{VP1+VN1}{2}$$

From equations above, it can be seen that the biasing of the input differential pair within the OpAmp 375 advantageously depends only on AGND and its own voltage from an immediately previous phase. Therefore, only a few clock cycles are needed to guarantee the following identity:

$$\frac{VP1+VN1}{2} = \frac{VP2+VN2}{2} = \frac{VP2''+VN2''}{2} = AGND$$

Figure 4:
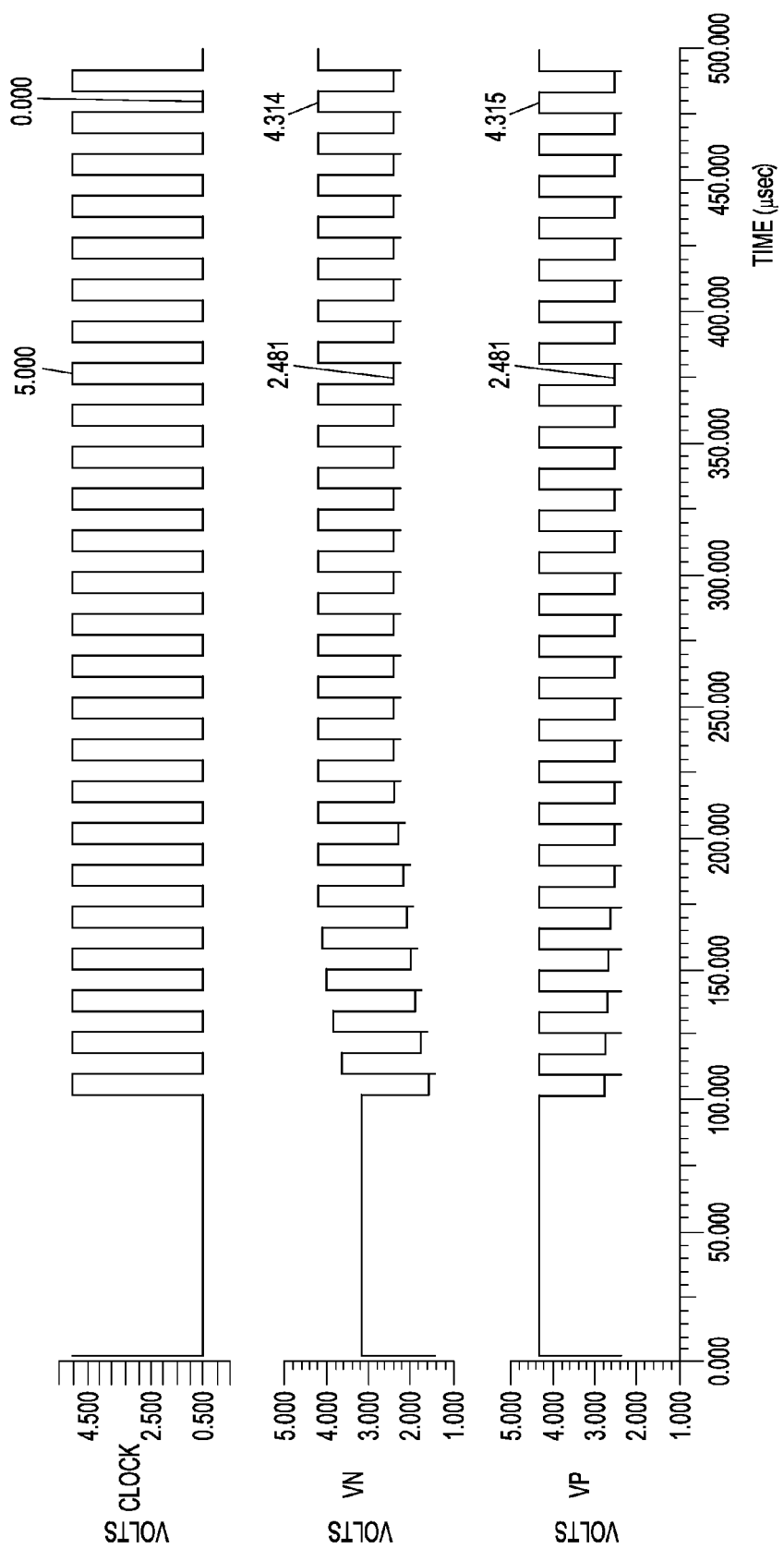
FIG. 4 is a chart of signals that occur in a simulation of a known switched-capacitor amplifier that has a fully differential architecture.

FIG. 4 is a chart of signals that occur in a simulation of a known CDS amplifier (similar to CDS amplifier 102, except with a fully differential architecture), in which VIP=400 mV, VIN=0V, $V_{CM}$=200 mV, $V_{DD}$=5V, $V_{SS}$=0V, and AGND=2.5V. The frequency of the clock signal for the simulation shown FIG. 4 is 65 kHz. In this example, both inputs, VIN and VIP, of the known CDS amplifier are near $V_{SS}$, i.e., 400 mV is considered to be near 0V. Clearly, $V_{CM}$ is near 0V. In this example, the OpAmp is a non-rail-to-rail OpAmp and the power supply rails of the OpAmp are 0V and 5V. In this example, the VP input terminal of the OpAmp disadvantageously swings from almost AGND (2.481V) during phase one to a voltage well above AGND (4.314V) during phase two. The VN input terminal of the OpAmp disadvantageously swings in a similar manner. In another example (not shown), if both inputs (VIP and VIN) of the known CDS amplifier were near $V_{DD}$, the VP terminal of the OpAmp would disadvantageously swing from almost AGND (2.481V) during phase one to a voltage well below AGND (not shown) during phase two. Because the OpAmp is a non-rail-to-rail OpAmp, the input differential pair of the OpAmp is far from its ideal bias point, thereby resulting in a gain loss. This gain loss causes the known CDS amplifier to lose resolution.

Figure 5:
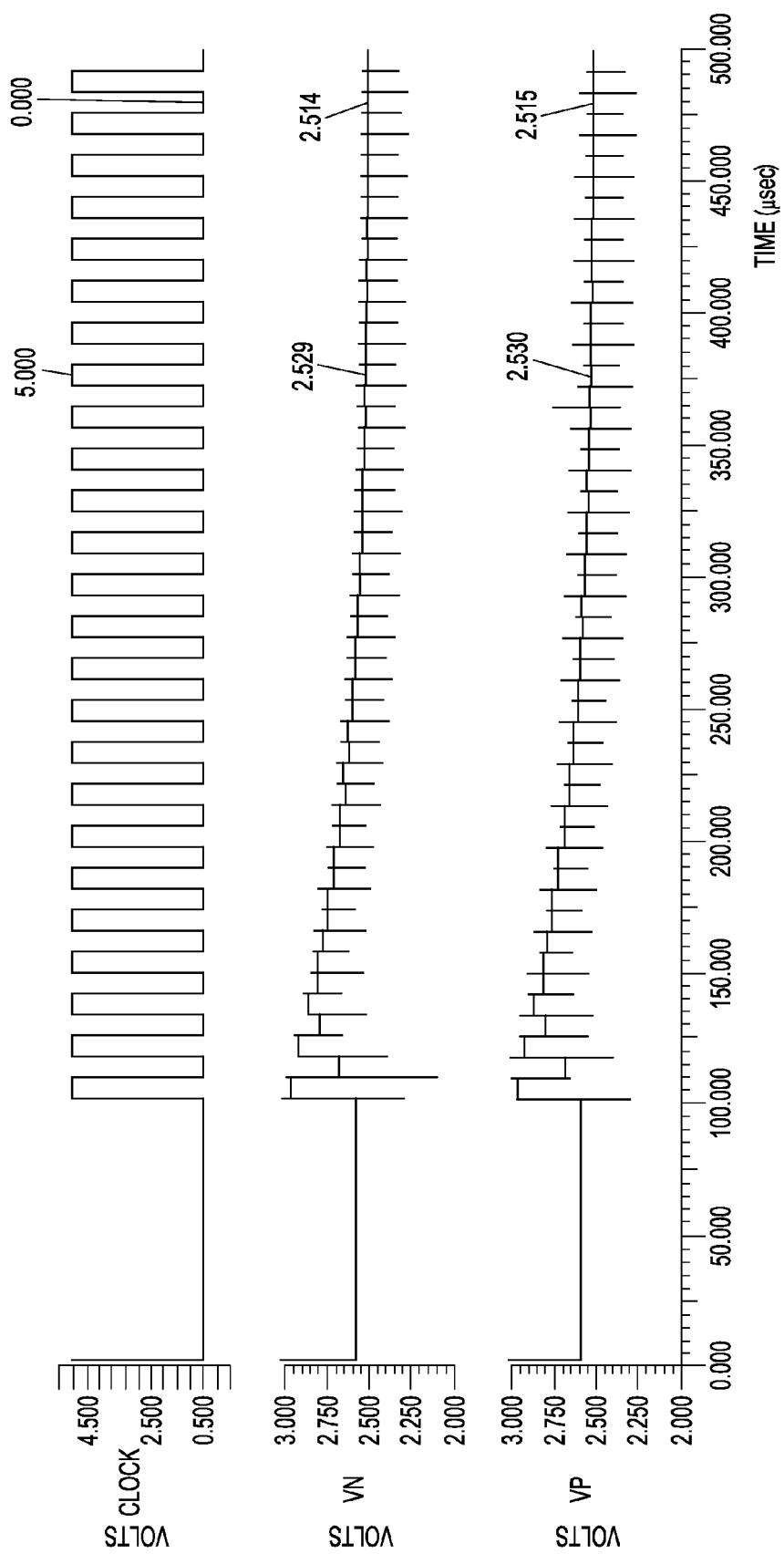
FIG. 5 is a chart of signals that occur in a simulation of the amplifier circuit of FIG. 3.

FIG. 5 is a chart of signals that occur in a simulation of the amplifier circuit 300 (which has a fully differential architecture), in which VIP=400 mV, VIN=0V, $V_{CM}$=200 mV, $V_{DD}$=5V, $V_{SS}$=0V, and AGND=2.5V. The input values, the operating voltages, and frequency of clock signal for the simulation shown in FIG. 5 are the same as for the simulation shown in FIG. 4. As with the example of FIG. 4, in the example of FIG. 5, the OpAmp is a non-rail-to-rail OpAmp and the power supply rails of the OpAmp are 0V and 5V. In this example, the VP input terminal 263 of the OpAmp 375 advantageously does not swing from one level during phase one to another level during phase two, in spite of the fact that both inputs of the amplifier circuit 300 are near $V_{SS}$. Rather, the VP input terminal 263 of the OpAmp 375 advantageously remains at a same level (2.515V) during both phase one and phase two. The VN input terminal 262 of the OpAmp 375 also advantageously remains at a same level (2.514V) during both phase one and phase two. Advantageously, the levels of the VN input terminal 262 (2.514V) and the VP input terminal 263 (2.515V) of the OpAmp 375 are near each other and near the ideal bias point of the input differential pair within the OpAmp This is a reason that there is no need for the OpAmp 375 to be a rail-to-rail OpAmp Because of the input network 201, the OpAmp 375 has minimal gain loss and the amplifier circuit 300 has improved resolution.

The output voltage VO at output terminal 264 of the amplifier circuit 200 and the output voltages VOP and VON at output terminals 376 and 377, respectively, of the amplifier circuit 300 advantageously settle faster than the output of a CDS amplifier that lacks input network 201, such as the known CDS amplifier 102. In a simulation of a known CDS amplifier (similar to CDS amplifier 102 except with a fully differential architecture), the outputs VOP and VON settle after about 225 µs. In a simulation of the amplifier circuit 300, the outputs VOP and VON settle after about 125 µs.

A disadvantage of the CDS technique is a strong dependence between the input common-mode voltage of known CDS amplifiers and the input common-mode voltage of an OpAmp in such known CDS amplifiers. Consequently, known rail-to-rail input CDS amplifiers, such as the known CDS amplifier 102 shown in FIG. 1, usually require a rail-to-rail input OpAmp (hereinafter "rail-to-rail OpAmp") Otherwise, linearity of such known CDS amplifiers greatly degrade because of out-of-range common-mode voltages at an input differential pair within the OpAmp of such known CDS amplifiers. On the other hand, the amplifier circuit 200 and 300 in accordance with the invention advantageously attains rail-to-rail operation in spite of not using a rail-to-rail OpAmp. The input network 201 permits the amplifier circuit 200 and 300 to have an enlarged allowed input common-mode voltage swing. The input network 201 allows the amplifier circuit 200 and 300 to operate in a rail-to-rail fashion without requiring an OpAmp able to operate in a rail-to-rail fashion.

The input network 201 allows the amplifier circuit 200 and 300 to be self-adjustable regarding the input common-mode voltage because the input common-mode voltage appears at one terminal of first common-mode switch 220 and second common-mode switch 221.

In one embodiment, the amplifier circuit 300 is used as part of a programmable gain amplifier (PGA), which may comprise one or more stages, each stage comprising the amplifier circuit 300, which has a differential output. In another embodiment of the PGA, a final stage of the PGA consists of the amplifier circuit 200, which has a single-ended output, instead of the amplifier circuit 300, which has a differential output. In still another embodiment, the amplifier circuit 200 and 300 is used as part of a fixed gain amplifier.

In yet another embodiment, the input network 201 is used with a switched-capacitor amplifier that does not use CDS. In a further embodiment, the input network 201 is used with a switched-capacitor circuit other than a switched-capacitor amplifier, such as a switched-capacitor filter. The architecture of the amplifier 200 and 300 can be extended to other CDS-based circuits, such as track-and-hold amplifiers, and sample-and-hold amplifiers.

In still another embodiment, the amplifier circuit 200 and 300 is part of a front end of an analog-to-digital (A/D) converter. For example, if an A/D converter has 16-bit resolution, then an amplifier circuit at the front end of the A/D converter should have at least 16-bit resolution. The amplifier circuit 200 and 300 has at least 16-bit resolution, regardless of the common-mode voltage of the input differential signal. Advantageously, the output of the amplifier circuit 200 and 300 has the output error of one-half of the LSB.

The amplifier circuit 200 and 300 does not require a rail-to-rail OpAmp to attain rail-to-rail characteristics. Therefore, OpAmp 275 and 375 of amplifier circuit 200 and 300, respectively, may be a non-rail-to-rail OpAmp. The amplifier circuit 200 overcomes the problem that occurs in the known CDS amplifier 102 when the input common-mode voltage is far from AGND.

Figure 1:
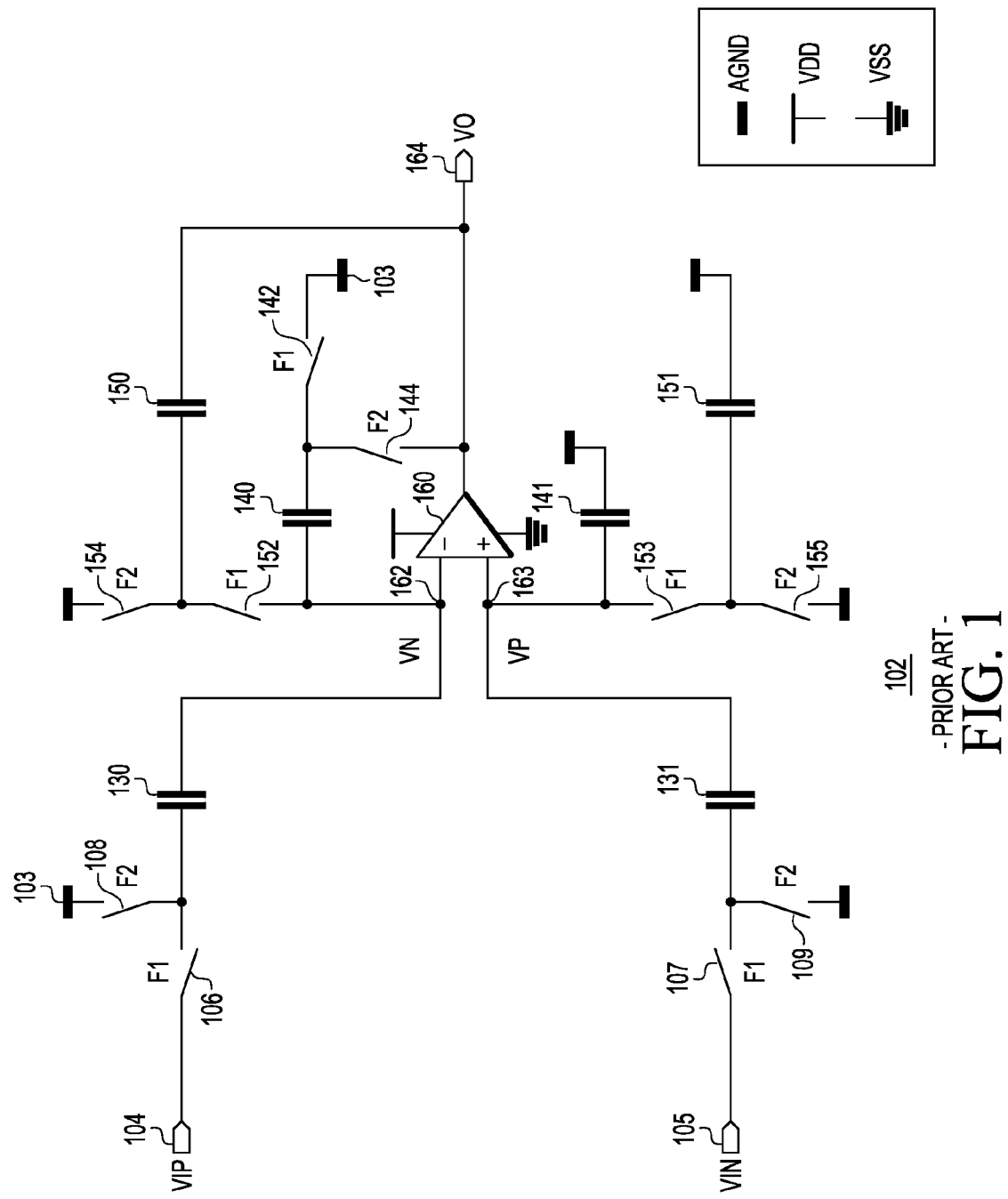
FIG. 1 is a schematic diagram of a known switched-capacitor amplifier having a single-ended output.

Disadvantageously, the known CDS amplifier 102 shown in FIG. 1 must use a rail-to-rail OpAmp or else be limited to accepting input differential signals that have a common-mode voltage near AGND to attain a gain with a given minimum resolution (measured in bits). The use of a rail-to-rail OpAmp in the known CDS amplifier 102 would increase design complexity (e.g., biasing and frequency compensation), die area and power consumption.

The amplifier circuit 200 and 300 is a rail-to-rail, CDS-based, switched-capacitor amplifier that, in one embodiment, does not need any extra circuits such as voltage or current references, voltage monitoring circuits, or additional circuitry for generating a correction voltage. Accordingly, the amplifier circuit 200 and 300 consumes low power, has low complexity, and occupies small die area compared to known CDS switched-capacitor amplifiers that use a rail-to-rail OpAmp The amplifier circuit 200 and 300 has a limited slew at the input terminals of the OpAmp 275 and 375, and has a limited slew at the output terminals(s) of the OpAmp, thereby relaxing design requirements of the OpAmp, the sampling capacitors, and switch sizing.

The amplifier circuit 200 and 300 maintains the benefits of CDS, such as auto-offset cancellation, and immune to finite OpAmp gain.

The amplifier circuit 200 and 300 relaxes the voltage swing at the input terminals of OpAmp 275 and 375, thereby making the amplifier circuit a low noise circuit with a wider input common-mode range. The amplifier circuit 200 and 300 compensates for the most important OpAmp non-idealities: finite open-loop gain, input-referred DC offset voltage, and 1/f noise.

In one embodiment, the amplifier circuit 200 and 300 is disposed an integrated circuit fabricated using a complementary metal oxide semiconductor (CMOS) process. Although, in one exemplary embodiment, the amplifier circuit 200 and 300 is disposed on an integrated circuit fabricated using CMOS technology, the amplifier circuit can also be disposed on an integrated circuit fabricated using other technologies. In one embodiment, when the amplifier circuit 200 and 300 is embodied in an integrated circuit, no components external of the integrated circuit are required.

Although the invention is described herein with reference to specific embodiments, various modifications and changes can be made without departing from the scope of the present invention as set forth in the claims below. For instance, although the exemplary embodiments show that the amplifier circuit 200 and 300 is disposed on a circuit-supporting substrate of an integrated circuit, the invention is equally usable when constructed entirely of components consisting of discrete devices. Although one embodiment of the amplifier circuit 200 and 300 may comprise FETs, another embodiment of the amplifier circuit 200 and 300 may comprise bipolar junction transistors.

Although the invention has been described with respect to specific conductivity types or polarity of potentials, skilled artisans appreciated that conductivity types and polarities of potentials may be reversed.

The specification and figures are to be regarded in an illustrative rather than a restrictive sense, and all such modifications are intended to be included within the scope of the present invention. Any benefits, advantages or solutions to problems described herein with regard to specific embodiments are not intended to be construed as a critical, required or essential feature or element of any or all the claims Unless stated otherwise, terms such as "first" and "second" are used to arbitrarily distinguish between the elements such terms describe. Thus, these terms are not necessarily intended to indicate temporal or other prioritization of such elements. Unless stated otherwise, terms such as "left" and "right" are used only to distinguish, in the drawings, between the elements such terms describe. Thus, these terms are not necessarily intended to indicate position of such elements in an actual embodiment. Note that the term "couple" has been used to denote that one or more additional elements may be interposed between two elements that are coupled.

Although the invention is described herein with reference to specific embodiments, various modifications and changes can be made without departing from the scope of the present invention as set forth in the claims below.

What is claimed is:

1. A switched-capacitor amplifier circuit, comprising:
   a switched-capacitor amplifier having a first input terminal and a second input terminal for receiving an input differential voltage, a first sampling capacitor switchably coupled to the first input terminal, and a second sampling capacitor switchably coupled to the second input terminal; and
   an input network, coupled to the switched-capacitor amplifier, the input network including:
   a first switch with one terminal connected to the first input terminal and another terminal connected to a first intermediate node,
   a first capacitor with one end connected to the first intermediate node and another end connected to an analog ground terminal,
   a second switch with one terminal connected to the first intermediate node and the other terminal connected to a node,
   a third switch with one terminal connected to the second input terminal and the other terminal connected to a second intermediate node, a second capacitor with one end connected to the second intermediate node and another end connected to the analog ground terminal, and a fourth switch with one terminal connected to the second intermediate node and another terminal connected to the node.

2. The switched-capacitor amplifier circuit of claim 1, in which the switched-capacitor amplifier has a single-ended output.

3. The switched-capacitor amplifier circuit of claim 1, in which the switched-capacitor amplifier has a differential output.

4. The switched-capacitor amplifier circuit of claim 1, in which the switched-capacitor amplifier in which the switched-capacitor amplifier includes an operational amplifier, and in which potentials at input terminals of the operational amplifier remain near analog ground potential as the switched-capacitor amplifier switches between phases.

5. The switched-capacitor amplifier circuit of claim 1, in which the switched-capacitor amplifier is configured to use a correlated double-sampling technique.

6. The switched-capacitor amplifier circuit of claim 1, in which the switched-capacitor amplifier includes:

a first sampling switch with one terminal connected to the first input terminal and having another terminal, a second sampling switch with one terminal connected to the second input terminal and having another terminal, an operational amplifier (OpAmp), a first sampling capacitor with one end coupled to the other terminal of the first sampling switch and another end coupled to an input terminal of the OpAmp, a second sampling capacitor with one end coupled to the other terminal of the second sampling switch and another end coupled to another input terminal of the OpAmp, a first common-mode switch with one terminal connected to the one end of the first sampling capacitor and having a second terminal, and a second common-mode switch with one terminal connected to the one end of the second sampling capacitor, and having a second terminal, and wherein potentials at the input terminals of the OpAmp remain near analog ground potential as the switched-capacitor amplifier switches between phases.

7. The switched-capacitor amplifier circuit of claim 6, in which the OpAmp is a non-rail-to-rail input OpAmp.

8. The switched-capacitor amplifier circuit of claim 7, in which the amplifier circuit linearly amplifies an input differential voltage at the first input terminal and the second input terminal when the input differential voltage at the first input terminal and the second input terminal is near an input rail of the OpAmp.

9. The switched-capacitor amplifier circuit of claim 7, in which the input network prevents the non-rail-to-rail input OpAmp from receiving an input differential signal that has a common-mode voltage at or near an input rail of the OpAmp.

10. The switched-capacitor amplifier circuit of claim 6, in which the switched-capacitor amplifier has a single-ended output.

11. The switched-capacitor amplifier circuit of claim 6, in which the switched-capacitor amplifier has a differential output.

12. The switched-capacitor amplifier circuit of claim 6, in which the switched-capacitor amplifier uses a correlated doubled sampling technique.

13. The switched-capacitor amplifier circuit of claim 6, in which the switched-capacitor amplifier does not use a correlated doubled sampling technique.

14. In a switched-capacitor circuit that includes a switched-capacitor amplifier, the switched-capacitor amplifier having differential input terminals and having alternating sampling and amplification phases, a method comprising steps of:

during a sampling phase, sampling a voltage VIP at a first input terminal of the switched-capacitor amplifier and storing a charge associated with the sampled voltage VIP in a first sampling capacitor of the switched-capacitor amplifier, sampling the voltage VIP at the first input terminal of the switched-capacitor amplifier and storing the charge associated with the sampled voltage VIP in a first capacitor of an input network coupled to the switched-capacitor amplifier, sampling a voltage VIN at a second input terminal of the switched-capacitor amplifier and storing a charge associated with the sampled voltage VIN in a second sampling capacitor of the switched-capacitor amplifier, and sampling the voltage VIN at the second input terminal of the switched-capacitor circuit and storing the charge associated with the sampled voltage VIN in a second capacitor of the input network; and during an amplification phase, subsequent to the sampling phase, coupling the first capacitor and the second capacitor of the input network to a node in the input network, thereby producing an input common-mode voltage $V_{CM}$ at the node, where $V_{CM}$=VIP+VIN/2, and coupling the node to the first input terminal and to the second input terminal of the switched-capacitor amplifier, thereby maintaining the first input terminal and the second input terminal of the switched-capacitor amplifier at the input common-mode voltage during the amplification phase of the switched-capacitor amplifier.

15. An integrated circuit, comprising:

a circuit-supporting substrate, the circuit-supporting substrate including:

a switched-capacitor circuit having a first input terminal and a second input terminal for receiving an input differential voltage, a first sampling capacitor switchably coupled to the first input terminal, and a second sampling capacitor switchably coupled to the second input terminal; and an input network, coupled to the switched-capacitor circuit, the input network including:

a first switch with one terminal connected to the first input terminal and another terminal connected to a first intermediate node, a first capacitor with one end connected to the first intermediate node and another end connected to an analog ground terminal, a second switch with one terminal connected to the first intermediate node and the other terminal connected to a node, a third switch with one terminal connected to the second input terminal and the other terminal connected to a second intermediate node, a second capacitor with one end connected to the second intermediate node and another end connected to the analog ground terminal, and a fourth switch with one terminal connected to the second intermediate node and another terminal connected to the node.

16. The integrated circuit of claim 15, in which the switched-capacitor circuit is an amplifier.

17. The integrated circuit of claim 16, in which the switched-capacitor circuit is an amplifier configured to use a correlated double-sampling technique.

18. The integrated circuit of claim 15, in which the input network maintains the node at an analog ground potential.

19. The integrated circuit of claim 18, in which the switched-capacitor circuit includes an operational amplifier, and in which potentials at input terminals of the operational amplifier remain near analog ground potential as the switched-capacitor circuit switches between phases.

20. The integrated circuit of claim 15, in which the switched-capacitor circuit is a filter.

* * * * *

UNITED STATES PATENT AND TRADEMARK OFFICE
CERTIFICATE OF CORRECTION

| | | |
|---|---|---|
| PATENT NO. | : 8,198,937 B1 | Page 1 of 1 |
| APPLICATION NO. | : 13/048113 | |
| DATED | : June 12, 2012 | |
| INVENTOR(S) | : Andre Luis Vilas Boas et al. | |

It is certified that error appears in the above-identified patent and that said Letters Patent is hereby corrected as shown below:

Col. 15, in claim 4, lines 14-15:

delete second appearance of "in which the switched-capacitor amplifier".

Col. 15, in claim 8, line 48:

change "the amplifier circuit linearly" to --the switched-capacitor amplifier linearly--.

Signed and Sealed this

Fourteenth Day of August, 2012

David J. Kappos
*Director of the United States Patent and Trademark Office*